United States Patent
Wuebbeler et al.

(10) Patent No.: US 11,448,708 B2
(45) Date of Patent: Sep. 20, 2022

(54) METHOD FOR DETERMINING AN AGEING PARAMETER, A STATE OF CHARGE PARAMETER AND A TEMPERATURE OF A RECHARGEABLE BATTERY, ESPECIALLY A LITHIUM RECHARGEABLE BATTERY

(71) Applicant: Volkswagen AG, Wolfsburg (DE)

(72) Inventors: Gerd Wuebbeler, Berlin (DE); Rainer Fuessler, Braunschweig (DE); Clemens Elster, Berlin (DE); Steffen Seitz, Wendeburg (DE); Martin Wuensch, Braunschweig (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 95 days.

(21) Appl. No.: 16/845,846

(22) Filed: Apr. 10, 2020

(65) Prior Publication Data
US 2020/0326380 A1   Oct. 15, 2020

(30) Foreign Application Priority Data
Apr. 11, 2019   (DE) ...................... 10 2019 109 622.7

(51) Int. Cl.
*G01R 31/392*  (2019.01)
*G01R 31/389*  (2019.01)
(Continued)

(52) U.S. Cl.
CPC ......... *G01R 31/392* (2019.01); *G01R 31/374* (2019.01); *G01R 31/382* (2019.01);
(Continued)

(58) Field of Classification Search
CPC .................................................... G01R 31/392
(Continued)

(56) References Cited

U.S. PATENT DOCUMENTS

| 8,849,598 B2 * | 9/2014 | Mingant | G01R 31/389 |
| | | | 702/63 |
| 10,180,460 B1 | 1/2019 | Castelaz | |

(Continued)

FOREIGN PATENT DOCUMENTS

| DE | 102016201026 A1 | 7/2017 |
| WO | WO2015014764 A2 | 2/2015 |

*Primary Examiner* — Ricky Go
(74) *Attorney, Agent, or Firm* — Muncy, Geissler, Olds & Lowe, P.C.

(57) ABSTRACT

A method for determining an ageing parameter $K_{SOH}$ of a rechargeable battery, especially a lithium rechargeable battery, featuring the steps (a) detecting an impedance Z of the rechargeable battery at different frequencies f, so that a Nyquist plot and a real part path, which plots a real part of the impedance Z against the frequency f, are obtained, determining at least one of the following SOH parameters, which can be selected from a predetermined list, establishing an SOH row vector $\vec{P}_{SOH}$ from the SOH parameters and all mixed terms of the form $p_{SOH,m} \cdot p_{SOH,n}$, m=1, ..., 11, n=1, ..., m. The invention provides for the multiplication of the SOH row vector $\vec{P}_{SOH}$ by a saved calibration vector $\vec{A}_{SOH}$, thereby obtaining the ageing parameter $K_{SOH}$.

10 Claims, 3 Drawing Sheets

(51) Int. Cl.
    *G01R 31/382*     (2019.01)
    *G01R 31/374*     (2019.01)
    *H02J 7/00*     (2006.01)

(52) U.S. Cl.
    CPC ............ *G01R 31/389* (2019.01); *H02J 7/005* (2020.01); *H02J 7/0048* (2020.01)

(58) Field of Classification Search
    USPC .......................................................... 702/63
    See application file for complete search history.

(56) References Cited

U.S. PATENT DOCUMENTS

| | | | |
|---|---|---|---|
| 10,209,314 B2 * | 2/2019 | Garcia | G06N 20/00 |
| 10,393,813 B2 * | 8/2019 | Sun | B60L 58/16 |
| 10,684,329 B2 * | 6/2020 | Gajewski | G01R 31/389 |
| 11,125,827 B2 * | 9/2021 | Wild | G01R 31/392 |
| 2003/0184307 A1 | 10/2003 | Kozlowski et al. | |
| 2012/0078552 A1 | 3/2012 | Mingant et al. | |
| 2013/0069660 A1 | 3/2013 | Bernard et al. | |

* cited by examiner

METHOD FOR DETERMINING AN AGEING PARAMETER, A STATE OF CHARGE PARAMETER AND A TEMPERATURE OF A RECHARGEABLE BATTERY, ESPECIALLY A LITHIUM RECHARGEABLE BATTERY

This nonprovisional application claims priority under 35 U.S.C. § 119(a) to German Patent Application No. 10 2019 109 622.7, which was filed in Germany on Apr. 11, 2019, and which is herein incorporated by reference.

BACKGROUND OF THE INVENTION

Field of the Invention

The present invention relates to a method for determining an ageing parameter, a state of charge parameter and a temperature of a rechargeable battery. The invention also relates to a method for determining an ageing parameter of the rechargeable battery, and relates to a method for determining a state of charge parameter of the rechargeable battery.

Description of the Background Art

Lithium rechargeable batteries, especially lithium ion rechargeable batteries, are being used to an increasing degree in electric vehicles. Unlike with vehicles that are driven by fossil fuels, in the case of rechargeable batteries it is difficult to determine the exact energy content available in the rechargeable battery. The range of the vehicle is dependent on the state of charge; for the user, it is important to know said range.

The capacity of the rechargeable battery, i.e. the maximum amount of electrical charge that can be stored, decreases over time and with an increasing number of charge and discharge cycles. The speed at which the capacity decreases also depends on the manner in which the rechargeable battery is charged and discharged. Therefore, it would be practical to be able to measure the current state of charge and the current ageing, i.e. in particular the current capacity of the rechargeable battery, on a regular basis.

The measurement of an ageing parameter, which describes the ageing of the rechargeable battery, can be achieved by first at least almost fully discharging the rechargeable battery and subsequently fully charging it. It is hereby possible to determine the electrical energy that can be stored in the rechargeable battery, i.e. its capacity.

The ageing is the decrease in capacity, which can be caused, for instance, by charging and discharging and/or storage. For example, the ageing parameter is the quotient of the nominal capacity of the rechargeable battery and the current capacity.

However, the disadvantage of this approach is that the rechargeable battery cannot be used while this measurement is being conducted. In other words, it must be ensured that the rechargeable battery is not needed during this time; this, however, is problematic. For electric vehicle users, it is not acceptable that the vehicle is unavailable for a longer period of time, for instance two days, because the capacity of the rechargeable battery has to be measured.

Attempts have therefore been made to make assertions on the current state of ageing of the rechargeable battery by means of electrochemical impedance spectroscopy. However, it has been proven that current approaches have little informative value.

US 2012/0078552 A1 describes a method for estimating the internal state of an electrochemical system for storing electrical energy, such as a battery. The SoC and electrochemical impedance are determined for various internal states of an electrochemical system of the same type as the examined electrochemical system. An electrochemical impedance model is then defined as a function of the SoC and parameters. These parameters are calibrated by adjusting the electrochemical impedance measurements for the various internal states. The electrochemical impedance Z of the examined system is determined and its SoC estimated using the model applied to the electrochemical impedance Z.

US 2013/0069660 A1 describes a method for estimating the inner state of a system for the electrochemical storage of electrical energy, such as a battery. Impedance measurements are conducted for various internal states of batteries of the same type as a battery that is to be analysed by adding an electric signal to the current flowing through the batteries. An RC switch is then used to model the impedances. A link is subsequently made between the SoC (and/or the SoH) and the parameters of the RC switch using a multivariate statistical analysis. A measurement of the impedance of the battery to be analysed is conducted, which is modelled using the RC switch. Finally, the connection of the equivalent electrical circuit defined for the battery to be analysed is used to estimate the internal state of this battery.

SUMMARY OF THE INVENTION

It is therefore an object of the present invention to provide a method for determining an ageing parameter $K_{SOH}$, a state of charge parameter $K_{SOC}$ of a rechargeable battery and a temperature T featuring the steps (a) detecting an impedance Z of the rechargeable battery at different frequencies f, so that a Nyquist plot and a real part curve, which plots a real part of the impedance Z against the frequency f, are obtained, (b) determining at least one of the following SOH parameters, as specified in claim 1, (c) establishing an SOH row vector from the SOH parameters and all mixed terms and (d) multiplying the row vectors by a saved calibration vector, thereby obtaining the ageing parameter $K_{SOH}$. The multiplication of vectors always means the scalar product (inner product).

The invention also solves the problem by means of a method for determining a state of charge parameter $K_{SOC}$ of a rechargeable battery and solves the problem by means of a method for determining a temperature T.

The invention also includes an electric vehicle, especially an electric car, with a rechargeable battery, especially a lithium rechargeable battery, and a control system that is configured to conduct a method according to the invention. To this end, the control system is specifically designed to automatically apply an electric current with different frequencies f to the rechargeable battery and to detect the associated impedance.

Within the scope of the present description, the ageing parameter should be understood to mean, for example, a parameter which indicates the capacity of the rechargeable battery at the current time. In particular, the ageing parameter is equal to the quotient of the nominal capacity of the rechargeable battery and the current capacity.

The state of charge parameter should be understood to mean, for example, a parameter which codes to what percentage of the current capacity the rechargeable battery is charged. This is a value, generally measured in ampere hours, for the electrical charge that is stored in the rechargeable battery and can be withdrawn from the rechargeable battery.

The temperature T should be understood to mean, for example, a temperature that can be measured on any temperature scale. It is possible, but not necessary, for the temperature to be the absolute temperature, a Celsius temperature or a Fahrenheit temperature. Specifically, it is possible that the temperature T refers to a freely selected reference point, for example the ideal operating temperature of the rechargeable battery.

The impedance Z of the rechargeable battery should be understood to mean, for example, the complex-value electrical alternating current resistance of the rechargeable battery. In particular, the impedance is measured by specifying a predetermined test current and a predetermined test voltage and by measuring the respective resulting voltage or current.

It is possible, but not necessary, for the Nyquist plot and the real time curve to be depicted as graphs. In particular, it is possible to determine the specified SOH parameters, SOC parameters and T parameters from the measured values of the impedance Z as a function of the frequency f.

The advantage of the invention is that the ageing parameter, the state of charge parameter and/or the temperature can be determined with a high degree of process reliability and relatively quickly. The use of 40 different frequencies for determining the impedance Z is thus sufficient. Preferably, at least 8 different frequencies are recorded per frequency decade, i.e. per interval [(n−1)*10 Hz, . . . , n*10 Hz], wherein n is a natural number. The frequency range, in which the frequencies lie, preferably extends from 10 mHz to 1 kHz.

It is possible to detect whether an electric vehicle, in which the rechargeable battery is installed, has been disabled. For example, this may be achieved by detecting that an ignition key has been removed and/or a mobile phone used for unlocking has moved out of the detection range of the electric vehicle. The method according to the invention is then conducted automatically, so that the ageing parameter, the state of charge parameter and/or the temperature are detected automatically.

It is also advantageous that, thanks to the simplicity of the parameters used, the course of the ageing parameter, the state of charge parameter or the temperature over time can be evaluated on a fleet of electric vehicles. This renders it possible to statically evaluate ageing behaviour of the rechargeable battery and thus improve the development of new rechargeable batteries.

The first waveform parameter is preferably determined by adjusting the region around the local minimum by means of a parabola. Such an adjustment procedure, also known as a fitting procedure, is known from the prior art and shall therefore not be described any further.

The third waveform parameter is preferably also determined on the basis of fitting to a straight, symmetrical model function, especially a parabola.

The fifth waveform parameter is preferably determined by fitting to a straight line. The straight line preferably extends in a linear range with a logarithmic representation of the frequency, wherein said range extends from approximately 0.5 Hz to approximately 2 Hz. Specifically, the linear range extends in the proximity of a base point of the diffusion branch close to the local minimum impedance.

When determining the sixth SOH parameter $p_{SOH6}$, the feature that the sensitivity frequency is adjacent to the semi-circular maximum frequency $f_{HbM}$ should be understood to mean that it lies in the outermost quintile of the interval between $f_{HbM}$ and the local minimum frequency $f_{LM}$. With regards to the eighth SOH parameter $p_{SOH8}$, the feature that the value of the impedance Z changes in a strictly monotonous manner with an ageing of the rechargeable battery should be understood particularly to mean that it refers to the frequency for which the value of the impedance changes to the greatest degree with ageing. The diffusion characterisation frequency $f_{diff}$ preferably lies at 10±3 mHz.

The local minimum frequency $f_{LM}$ can be determined as the 11th SOH parameter $p_{SOH11}$.

When establishing the row vectors, it is possible, but not necessary, for this row vector to be formulated explicitly as a vector. It is only relevant that the mathematical operation conducted delivers the same result as indicated in the claim.

If 11 SOH parameters are used, as is provided for according to the preferred embodiment, the mixed terms are of course calculated up to m=11.

According to a preferred embodiment, at least two, especially at least three, preferably at least four, preferably at least five, preferably at least six, preferably at least seven, preferably at least eight, preferably at least nine, especially preferably at least ten, of the SOH parameters are determined.

According to a preferred embodiment, precisely two, three, four, five, six, seven, eight, nine or ten of the SOH parameters are determined.

According to a preferred embodiment, at least two, especially at least three, preferably at least four, preferably at least five, preferably at least six of the SOC parameters are determined.

According to a preferred embodiment, precisely two, especially precisely three, preferably precisely four, preferably precisely five, preferably precisely six of the SOC parameters are determined.

According to a preferred embodiment, at least two, especially at least three, preferably at least four of the T parameters are determined.

According to a preferred embodiment, precisely two, especially precisely three, preferably precisely four of the T parameters are determined.

According to a preferred embodiment of the method for determining the ageing parameter $K_{SOH}$, the SOH calibration vector is calculated by way of the following steps: (α) providing a new rechargeable battery, (β) measuring the ageing parameter $K_{SOH,ist}$ at room temperature and measuring the SOH parameters $p_{SOH,i}$, i=1, . . . , 11, at Q different temperatures and M different states of charge, wherein the ageing parameter $K_{SOH,ist}$ is a capacity of the rechargeable battery at room temperature, (χ) ageing the rechargeable battery by a predetermined ageing in the form of a number of charge and discharge cycles or in the form of storage for a predetermined period of time, (δ) repeating N−1-fold the steps (β) and (χ), so that N·M·Q ageing-dependent SOH parameters $p_{SOH,i}(r)$, r=1, . . . , N·M·Q are obtained, each with associated ageing parameters $K_{SOH,ist}(r)$, wherein in accordance with step (β) the associated ageing parameter $K_{SOH,ist}(r)$ has the same value for all M·Q SOH parameters $p_{SOH,i}(r)$ of an ageing step, and (E) calculating a calibration vector $\vec{A}_{SOH}$.

The provision of the new rechargeable battery should be understood especially to mean that its capacity is at least 99% of the nominal capacity. The nominal capacity is a property of the rechargeable battery and it is specified by the manufacturer.

The calculation of the SOH calibration factor preferably comprises: (α) establishing an SOH measured value vector $$\vec{M_{SOH,ist}} = \begin{pmatrix} K_{SOH,ist}(1) \\ K_{SOH,ist}(2) \\ \vdots \\ K_{SOH,ist}(N \cdot M \cdot Q - 1) \\ K_{SOH,ist}(N \cdot M \cdot Q) \end{pmatrix} \text{ from}$$

the ageing-dependent ageing parameters $K_{SOH,ist}(r)$, (β) establishing an SOH parameter matrix, $$P_{SOH,ist} = \begin{pmatrix} \vec{P}_{SOH,ist}(1) \\ \vec{P}_{SOH,ist}(2) \\ \vdots \\ \vec{P}_{SOH,ist}(N \cdot M \cdot Q) \end{pmatrix}$$

the rows of which contain the row vectors $\vec{P}_{SOH,ist}(r)$, r=1, ..., N·M·Q, which are comprised of the SOH parameters and all mixed terms of the form $p_{SOH,m} \cdot p_{SOH,n}$, m=1, ..., 11, n=1, ..., m and (χ) calculating the SOH calibration vector $\vec{A_{SOH}}$, which optimally solves the system of equations $\vec{M_{SOH,ist}} = P_{SOH,ist} \cdot \vec{A_{SOH}}$ while only retaining the significant components of $\vec{A_{SOH}}$, wherein the non-significant components are set to zero and the significant components of $\vec{A_{SOH}}$ are iteratively detected by means of stepwise regression.

It is especially beneficial if at least all SOH parameters are determined and the specified steps then executed. Subsequently, when the method is to be conducted again, it is enough to only use those SOH parameters that have not been set to zero.

The feature that the non-significant components are set to zero and the significant components of $\vec{A_{SOH}}$ are iteratively detected by means of stepwise regression should be understood particularly to mean that the p value of an F statistic is used as a significance criterion, wherein according to step (1) the p value for each component of a vector $\vec{A_{SOH_1}}$ is calculated using the equation $\vec{M_{SOH}} = P_{SOH_i} \cdot \vec{A_{SOH_1}}$, wherein the index expansion i indicates that this variable is iterated, with $\vec{A_{SOH_1}} = \vec{A_{SOH}}$ and $P_{SOH_i} = P_{SOH}$ in the first iteration step. Should any non-significant terms of $\vec{A_{SOC_1}}$ with associated p values above a threshold value of, for example, 0.1 exist, the element $ea_{SOH}$ of $\vec{A_{SOH_1}}$ associated with the greatest p value and the associated column $e\vec{P}_{SOH}$ of $P_{SOHi}$ is eliminated from the system of equations $\vec{M_{SOH}} = P_{SOHi} \cdot \vec{A_{SOH_1}}$. This results in a new vector $\vec{A_{SOH_1-}}$ and a new SOH parameter matrix $P_{SOHi-}$. If all p values are below the threshold value, $\vec{A_{SOH_1-}} = \vec{A_{SOH_1}}$ and $P_{SOHi-} = P_{SOHi}$ apply (no change in the vector or the SOH parameter matrix).

According to a step (2), if eliminated components $ea_{SOH,g}$, g=1, ..., G (G being the number of the eliminated components) exist, a test is conducted as follows to see whether their reconsideration leads to a significantly better fit of the system of equations: One of the eliminated components $ea_{SOH,g}$ and the respective associated column vector $e\vec{P}_{SOH,g}$ is re-added to $\vec{A_{SOH_1-}}$ or $P_{SOHi-}$, thereby producing the vector $\vec{A_{SOH,+}}$ and the SOH parameter matrix $P_{SOHi+}$. The p value is calculated for each component of the vector $\vec{A_{SOH_1+}}$ from the equation $\vec{M_{SOH}} = P_{SOHi+} \cdot \vec{A_{SOH_1+}}$. If any p values that are associated with re-added $ea_{SOH,g}$ exist below a threshold value of, for example, 0.05, the component $ea_{SOH,g}$ associated with the smallest p value is re-added to $\vec{A_{SOH_1-}}$ and the corresponding column $e\vec{P}_{SOH,g}$ to $P_{SOHi-}$. This results in a new vector $\vec{A_{SOH_1}}$ and a new SOH parameter matrix $P_{SOCi}$, with which the next iteration can be conducted. If all p values associated with $ea_{SOH,g}$ components are above the threshold value, $\vec{A_{SOH_1}} = \vec{A_{SOH_1-}}$ and $P_{SOHi} = P_{SOHi-}$ apply (no change in the vector or the SOH parameter matrix). Steps (1) and (2) are iterated until no more components are eliminated or added.

The SOH parameter matrix contains—in numbers—the row vectors from the elements $p_{SOH,i}$ and the corresponding mixed terms. It should be noted that it is possible, but not necessary, that the SOH parameter matrix is generated in a matrix format. It is only relevant that a calculation is conducted which corresponds to the specified calculation using the matrix. For example, the matrix equation may also be represented as a sum over the corresponding matrix elements.

The calculation of the SOC calibration vector preferably comprises the steps for determining the SOC parameters and the discharge of the rechargeable battery are preferably conducted at least 10 times, preferably at least 20 times. The more points of measurement recorded, the higher the degree of accuracy that can be achieved later. The iterative regression has been described above in connection with the calculation of the SOH calibration vector.

The calculation of the T calibration vector preferably comprises the steps for determining the T parameters and the discharge of the rechargeable battery are preferably conducted at least 10 times, preferably at least 20 times. The more points of measurement recorded, the higher the degree of accuracy that can be achieved later. The iterative regression has been described above in connection with the calculation of the T calibration vector.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
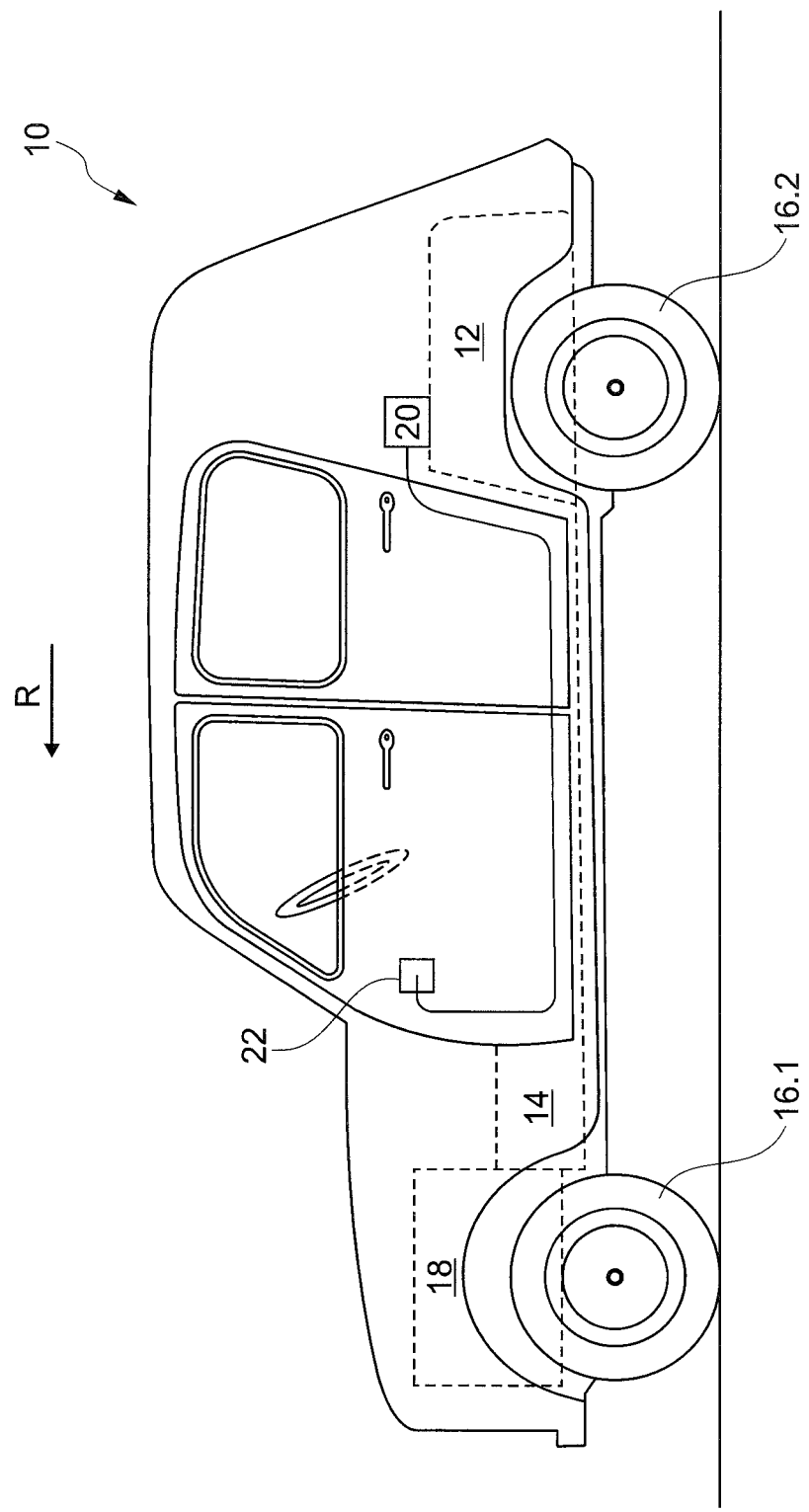
FIG. 1 shows a schematic view of a vehicle according to the invention.

FIG. 1 depicts an electric vehicle 10 according to the invention with a rechargeable battery 12 for driving a motor 14, which drives wheels, of which the wheels 16.1 and 16.2 can be seen.

It is possible that the electric vehicle 10 is a hybrid vehicle. In this case, the electric vehicle 10 has a combustion engine 18 to drive the wheels 16. Alternatively or additionally, the engine 18 has an electric generator to charge the rechargeable battery 12. It is also possible that the engine 18 is not designed to directly drive the wheels, but to drive at least one electric motor, which for its parts drives the wheels 16.

The electric vehicle 10 comprises a control system 20, which is designed to supply the motor 14 with electrical energy from the rechargeable battery 12. The control system 20 is preferably connected to an authentication device 22, which may be an ignition switch or a communication device for communicating with a mobile phone. In the case of the latter, the communication device is designed to enable an operation of the motor 14 by a user of the electric vehicle 10 by means of an authentication key of a mobile phone.

If the control system 20 detects that the electric vehicle 10 is not in use, for instance by detecting that the ignition key has been removed and/or the mobile phone used for authentication has moved more than a predetermined distance away from the electric vehicle 10, the control system 20 applies an electric current with a frequency f to the rechargeable battery 12 and measures the impedance Z(f).

The measurement of the impedance Z preferably comprises more than one period of the alternating voltage. Upon reaching the minimum number of periods of the electric current, the control system applies a second frequency to the rechargeable battery 12 that is different from the first frequency. This allows for the respective associated impedances Z(f) to be detected for a multitude of frequencies f.

For example, 8-10 frequencies are recorded per frequency decade. These are evenly distributed across a logarithmic scale. There are preferably at least five frequencies in the range of the semi-circular maximum.

Figure 2:
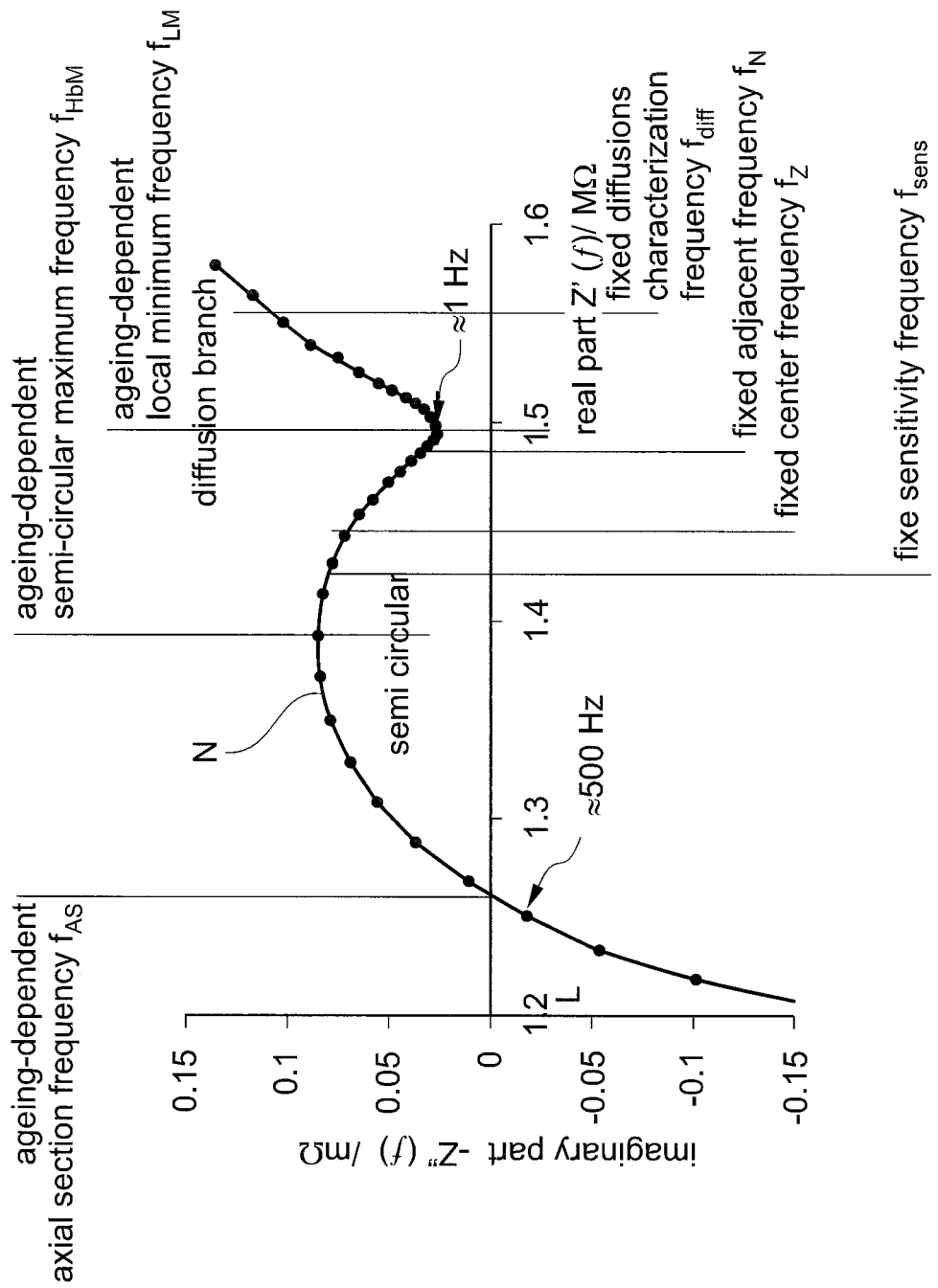
FIG. 2 shows a Nyquist plot of a rechargeable battery of the vehicle according to FIG. 1.

FIG. 2 shows a Nyquist plot, which has been obtained using the measurement data achieved in the way described. A semi-circular maximum frequency $f_{HbM}$ is plotted, in which the Nyquist plot N passes through a local maximum. It also results in a local minimum frequency $f_{LM}$, in which the Nyquist plot N passes through a local minimum.

In a sensitivity frequency $f_{sens}$, the value of the impedance Z changes in a strictly monotonous manner as the ageing increases. For example, the sensitivity frequency $f_{sens}$ is approximately 10 Hz. The Nyquist plot can also be used to obtain a diffusion characterisation frequency $f_{diff}$.

In an axial section frequency $f_{AS}$ of the Nyquist plot N, the imaginary part of the impedance Z is zero. Therefore, Im(Z)=0. The frequencies plotted above the Nyquist plot N in FIG. 2 depend on the ageing of the rechargeable battery, which means that they change as ageing increases. Conversely, the frequencies depicted below are fixed, meaning that they do not depend on the ageing.

Figure 3:
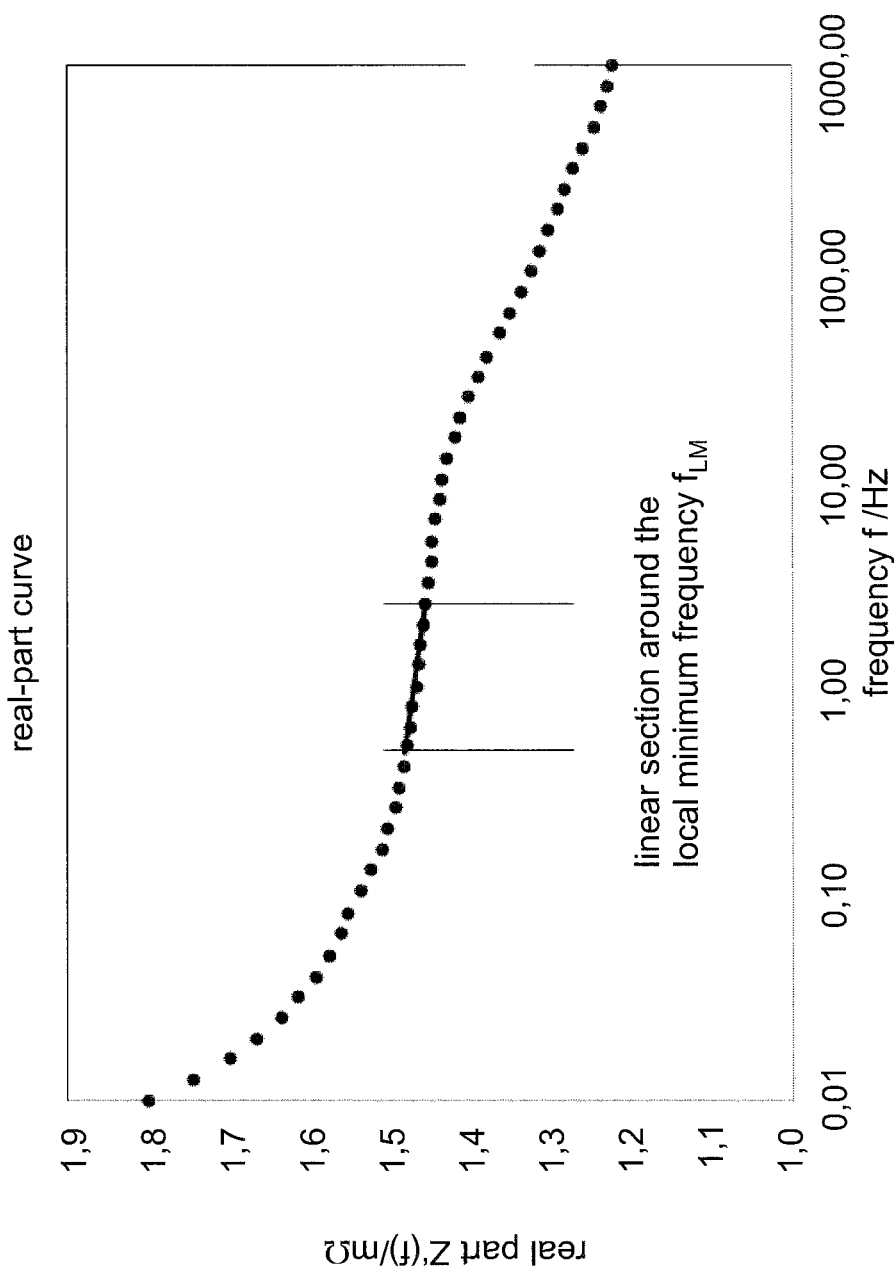
FIG. 3 shows a real part curve, which plots a real part of the impedance Z against the frequency f.

FIG. 3 shows a real part curve, in which the real parts of the impedance Z(f) are plotted against a logarithmic representation of the frequency f.

Once the control system 20 has recorded the impedances Z(f) and therefore the Nyquist plot N, the following SOH parameters $p_{SOH,i}$ are determined:
(i) $p_{SOH1}=\text{Re}(Z_{HbM})=\text{Re}(Z(f))$ with $f=f_{HbM}$,
(ii) $p_{SOH2}=\text{Im}(Z_{HbM})$,
(iii) $p_{SOH3}=\text{Re}(Z_{LM})$,
(iv) $p_{SOH4}=\text{Im}(Z_{LM})$,
(v)

$$p_{SOH5} = s = \left.\frac{dZ(\text{Re}(Z))}{d\log(f)}\right|_{f\in B},$$

wherein B is the linear range of the real part curve at low frequencies f, which is shown in FIG. 3, e.g. B=[0.5 Hz, . . . , 2 Hz],
(vi) $p_{SOH6}=\text{Re}(Z_{sens})=\text{Re}(Z(f))$ with $f=f_{sens}$,
(vii) $p_{SOH7}=\text{Im}(Z_{sens})$,
(viii) $p_{SOH8}=\text{Re}(Z_{diff})=\text{Re}(Z(f))$ with $f=f_{diff}$,
(ix) $p_{SOH9}=\text{Im}(Z_{diff})$,
(x) $p_{SOH10}=f_{HbM}$,
(xi) $p_{SOH11}=f_{LM}$.

The linear range B is the section of the real part curve around the local minimum frequency $f_{LM}$, in which the real part curve can be linearly approximated to a very good approximation.

The following SOC parameters are also determined:
(i) $p_{SOC1}=p_{SOH1}$,
(ii) $p_{SOC2}=p_{SOH2}$,
(iii) $p_{SOC3}=p_{SOH3}$,
(iv) $p_{SOC4}=\text{Re}(Z_{sens})=\text{Re}(Z(f_{sens}))$,
(v) $p_{SOC5}=\text{Im}(Z_{sens})$,
(vi) $p_{SOC6}=p_{SOC4}-\text{Re}(Z_N)$, with $Z_N=Z(f_N)$, wherein $f_N$ is a frequency known as adjacent frequency, which
   is greater than the local minimum frequency $f_{LM}$,
   is smaller than a center frequency $f_Z$, and
   differs from the local minimum frequency $f_{LM}$ by at most $(f_Z-f_{LM})/5$,
   wherein $f_Z$ is a frequency known as center frequency, which lies in a central third between the semi-circular maximum frequency $f_{HbM}$ and the local minimum frequency $f_{LM}$, and
(vii) $p_{SOC7}$: a phase φ of the impedance $Z_Z=Z(f)$ at $f=f_Z$.

The following T parameters T are also determined:
(i) $p_{T1}=p_{SOC4}$,
(ii) $p_{T2}=p_{SOC5}$,
(iii) $p_{T3}=p_{SOH8}$,
(iv) $p_{T4}=p_{SOH9}$ and
(v) $p_{T5}=f_{AS}$, wherein $f_{AS}$ is a frequency known as axial section frequency, at which the imaginary part of the impedance is zero and which is greater than the semi-circular maximum frequency ($f_{HbM}$).

The control system 20 calculates the ageing parameter $K_{SOH}$ by establishing an SOH row vector $\vec{P}_{SOH}$ from the SOH parameters and all mixed terms of the form $p_{SOH,m} \cdot p_{SOH,n}$, m=1, . . . , 11, n=1, . . . , m and subsequently multiplying the SOH row vector $\vec{P}_{SOH}$ by a calibration vector saved in the control system 20 $\vec{A}_{SOH}$. If the ageing parameter $K_{SOH}$ drops below a predetermined nominal ageing parameter, a message is emitted which codes such a situation.

The control system 20 also calculates the state of charge parameter $K_{SOC}$ by establishing an SOC row vector $\vec{P}_{SOC}$ from the SOC parameters and all mixed terms of the form $p_{SOC,m} \cdot p_{SOC,n}$, m=1, . . . , 7, n=1, . . . , m and subsequently multiplying the SOC row vector $\vec{P}_{SOC}$ by a saved SOC calibration vector $\vec{A}_{SOC}$. This state of charge parameter $K_{SOC}$ is displayed in a cockpit of the electric vehicle 10, for example. If the state of charge parameter $K_{SOC}$ drops below a predetermined nominal state of charge parameter, a message is emitted which codes such a situation.

The control system 20 also calculates the temperature T of the rechargeable battery 12 by establishing a T row vector $\vec{P}_T$ from the T parameters and all mixed terms of the form $p_{T,m} \cdot p_{T,n}$, m=1, ..., 5, n=1, ..., m and subsequently multiplying the T row vector $\vec{P}_T$ by a saved calibration vector $\vec{A}_T$. If the temperature T drops below a predetermined maximum temperature, a message is emitted which codes such a situation. Alternatively or additionally, the power of the electric vehicle 10 is reduced.

Determining the Calibration Vectors

To determine the calibration vectors, a new rechargeable battery 12 is used. A new rechargeable battery should be understood to mean a rechargeable battery which has completed a maximum of 10 charge-discharge cycles and/or has a capacity of at least 99% of the nominal capacity.

This rechargeable battery is used to determine the ageing parameter $K_{SOH}$, the SOH parameters $p_{SOH,i}$, the state of charge parameter $K_{SOC}$, the SOC parameters $p_{SOC,j}$, the temperature T and the temperature parameters $p_{Tk}$. This is done, for example, at room temperature (23° C.). The ageing parameter $K_{SOH}$ is, for instance, the capacity in ampere hours or a relative capacity in terms of the nominal capacity.

A state of charge SOC is then adjusted at room temperature, which is quantified by the state of charge parameter $K_{SOC,ist}$. In other words, the rechargeable battery is charged or discharged. The specified measured variables are measured again, thereby obtaining measured values. These steps are conducted for M states of charge. For instance, the state of charge parameters $K_{SOC,ist}$ 100%, 80%, 65%, 50%, 35% and 20% are set.

The temperature T of the rechargeable battery is then changed and the specified measured variables are measured again. These steps are conducted for Q different temperatures, which are quantified by measured temperatures KT. These steps may also be carried out prior to changing the state of charge.

The ageing of the rechargeable battery 12 is subsequently changed by fully or partially charging and discharging the rechargeable battery 12 several times. Alternatively or additionally, the rechargeable battery is stored and aged at a storage temperature that is at least 20 Kelvin above the room temperature. The measured variables, i.e. the ageing parameter $K_{SOH}$, the SOH parameters $p_{SOH,i}$, the state of charge parameter $K_{SOC}$, the SOC parameter $p_{SOC,j}$, the temperatures T and the T parameters $p_{Tk}$ are recorded after every ageing step.

The steps of adjusting the states of charge and the temperatures are repeated several times for each ageing stage, so that in each case N·M·Q measured values in the form of the ageing, state of charge and temperature dependent SOH parameters $p_{SOH,i}$, SOC parameters $p_{SOC,j}$ and temperature parameters $p_{Tk}$ are obtained, each with an associated SOH parameter $K_{SOH,ist}$, an associated SOC parameter $K_{SOC,ist}$ and an associated temperature $K_{T,ist}$.

An SOH measured value vector $$\vec{M}_{SOH,ist} = \begin{pmatrix} K_{SOH,ist}(1) \\ K_{SOH,ist}(2) \\ \vdots \\ K_{SOH,ist}(N \cdot M \cdot Q - 1) \\ K_{SOH,ist}(N \cdot M \cdot Q) \end{pmatrix}$$

is subsequently established from the ageing-dependent ageing parameters $K_{SOH,ist}$ (r), r=1, ..., N·M·Q as is an SOH parameter matrix $$P_{SOH,ist} = \begin{pmatrix} \vec{P}_{SOH,ist}(1) \\ \vec{P}_{SOH,ist}(2) \\ \vdots \\ \vec{P}_{SOH,ist}(N \cdot M \cdot Q) \end{pmatrix},$$

the rows of which contain the row vectors $\vec{P}_{SOH,ist}(r)$, r=1, ..., N·M·Q. The row vectors contain the SOH parameters for a measurement and all mixed terms of the form $p_{SOH,m} \cdot p_{SOH,n}$, m=1, ..., 11, n=1, ..., m.

This is followed by the calculation of the vector that solves the system of equations $\vec{M}_{SOH,ist} = P_{SOH,ist} \cdot \vec{A}_{SOH}$ with the smallest error (sum of error squares). This is achieved by means of stepwise regression, as described above. The solution vector is the SOH calibration vector $\vec{A}_{SOH}$.

The SOC calibration vector $\vec{A}_{SOC}$ and the calibration vector $\vec{A}_T$ are calculated in same way.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for determining an ageing parameter $K_{SOH}$ of a rechargeable battery of a vehicle, the method comprising:
   (a) applying, by a control system of the vehicle, an electric current to the rechargeable and detecting an impedance Z of the rechargeable battery at different frequencies f, so that a Nyquist plot and a real part path, which plots a real part of the impedance Z against the frequency f, are obtained,
   (b) determining at least one of the following SOH parameters:
      (i) a first waveform parameter ($p_{SOH1}$) in the form of a real part of a semi-circular maximum impedance (Re($Z_{HbM}$)) at a semi-circular maximum frequency ($f_{HbM}$) in which the Nyquist plot passes through a local maximum,
      (ii) a second waveform parameter ($p_{SOH2}$) in the form of an imaginary part of the semi-circular maximum impedance (Im($Z_{HbM}$)),
      (iii) a third waveform parameter ($p_{SOH3}$) in the form of a real part of a local minimum impedance (Re($Z_{LM}$)) of the impedance at a local minimum frequency $f_{LM}$ in which the Nyquist plot passes through a minimum between the semi-circular maximum frequency $f_{HbM}$ and a diffusion branch, (iv) a fourth waveform parameter ($p_{SOH4}$) in the form of an imaginary part of the local minimum impedance ($\text{Re}(Z_{LM})$), (v) a fifth waveform parameter ($p_{SOH5}$) in the form of a pitch s of the real part of the impedance in a linear region B of the real part path, (vi) a sixth SOH parameter ($p_{SOH6}$) in the form of a real part of the impedance Z at a sensitivity frequency $f_{sens}$, for which the following applies:

the sensitivity frequency $f_{sens}$ is smaller than the semi-circular maximum frequency $f_{HbM}$, is adjacent to the semi-circular maximum frequency $f_{HbM}$ and changes in a strictly monotonous manner with an increasing ageing a of the value $|Z|$ of the impedance Z at a temperature and a state of charge, (vii) a seventh SOH parameter ($p_{SOH7}$) in the form of an imaginary part of the impedance Z at the sensitivity frequency $f_{sens}$, (viii) an eighth SOH parameter ($p_{SOH8}$) in the form of a real part of the impedance Z at a diffusion characterisation frequency $f_{diff}$, for which the following applies:

the diffusion characterisation frequency $f_{diff}$ is smaller than the local minimum frequency $f_{LM}$, and the value $|Z|$ of the impedance Z changes in a strictly monotonous manner with an ageing a of the rechargeable battery (12) at a temperature and a state of charge, (ix) a ninth SOH parameter ($p_{SOH9}$) in the form of an imaginary part of the impedance Z at the diffusion characterisation frequency $f_{diff}$, (x) a tenth SOH parameter ($p_{SOH10}$) in the form of the semi-circular maximum frequency ($f_{HbM}$), or (xi) an eleventh SOH parameter ($p_{SOH11}$) in the form of the local minimum frequency ($f_{LM}$);

(c) establishing an SOH row vector $\vec{P}_{SOH}$ from the SOH parameters and all mixed terms of the form $p_{SOH,m} \cdot p_{SOH,n}$, m=1, . . . , 11, n=1, . . . , m; and (d) multiplying the SOH row vector $\vec{P}_{SOH}$ by a saved calibration vector $\vec{A}_{SOH}$, thereby obtaining the ageing parameter $K_{SOH}$, wherein a message is emitted when the ageing parameter drops below a predetermined nominal ageing parameter.

2. The method according to claim 1, wherein all SOH parameters are determined.

3. A method for determining a state of charge parameter $K_{SOC}$ of a rechargeable battery of a vehicle, the method comprising:

(a) applying, by a control system of the vehicle, an electric current to the rechargeable and detecting an impedance Z of the rechargeable battery at different frequencies f, so that a Nyquist plot is obtained;

(b) determining at least one of the following SOC parameters:

(i) a first SOC parameter ($p_{SOC1}$) in the form of the first waveform parameter ($p_{SOH1}$), (ii) a second SOC parameter ($p_{SOC2}$) in the form of the second waveform parameter ($p_{SOH2}$), (iii) a third SOC parameter ($p_{SOC3}$) in the form of the third waveform parameter ($p_{SOH3}$), (iv) a fourth SOC parameter ($p_{SOC4}$) in the form of the real part of the impedance at the sensitivity frequency $f_{sens}$, (v) a fifth SOC parameter ($p_{SOC5}$) in the form of the imaginary part of the impedance at the sensitivity frequency $f_{sens}$, (vi) a sixth SOC parameter ($p_{SOC6}$) in the form of a difference from:

the fourth SOC parameter ($p_{SOC4}$) (=the real part of the impedance at the sensitivity frequency $f_{sens}$) and the real part of the impedance at a fixed adjacent frequency $f_N$, which is greater than the local minimum frequency $f_{LM}$ in an unaged rechargeable battery and is adjacent to said frequency and is smaller than the center frequency $f_Z$, and (vii) a seventh SOC parameter ($p_{SOC7}$) in the form of a phase ($\varphi$) of the impedance at a center frequency $f_Z$, which lies in a central third between the semi-circular maximum frequency $f_{HbM}$ and the local minimum frequency $f_{LM}$, (c) establishing an SOC row vector P from the SOC parameters and all mixed terms of the form $p_{SOC,m} \cdot p_{SOC,n}$, m=1, . . . , 7, n=1, . . . , m; and (e) multiplying the SOC row vector $\vec{P}_{SOC}$ by a saved SOC calibration vector $\vec{A}_{SOC}$, thereby obtaining the state of charge parameter $K_{SOC}$, wherein a message is emitted when the state of charge drops below a predetermined nominal state of charge.

4. The method according to claim 3, wherein all SOC parameters are determined.

5. The method according to claim 3, wherein that the calculation of the SOC calibration vector $\vec{A}_{SOH}$ comprises the following steps:

(α) establishing an SOC vector $$\vec{M}_{SOC,ist} = \begin{pmatrix} K_{SOC,ist}(1) \\ K_{SOC,ist}(2) \\ \vdots \\ K_{SOC,ist}(N \cdot M \cdot Q - 1) \\ K_{SOC,ist}(N \cdot M \cdot Q) \end{pmatrix}$$

from the SOC parameters $K_{SOC,ist}$ (r), r=1, . . . , N·M·Q, (β) establishing an SOC parameter matrix, $$P_{SOC,ist} = \begin{pmatrix} \vec{P}_{SOC,ist}(1) \\ \vec{P}_{SOC,ist}(2) \\ \vdots \\ \vec{P}_{SOC,ist}(N \cdot M \cdot Q) \end{pmatrix}$$

the rows of which contain the row vectors $\vec{P}_{SOC,ist}(j)$, j=1, . . . , N·M·Q, wherein the row vector $\vec{P}_{SOC,ist}(j)$ is established from the SOC parameters and all mixed terms of the form $p_{SOC,ist,m} \cdot p_{SOC,ist,n}$, (χ) calculating the SOC calibration vector $\vec{A}_{SOC}$ that optimally approximates the system of equations $\overrightarrow{M_{SOC,ist}} = P_{SOC,ist} \cdot \overrightarrow{A_{SOC}}$ while only retaining the significant components of $\overrightarrow{A_{SOC}}$, wherein the non-significant components are set to zero and wherein the significant components of $\overrightarrow{A_{SOC}}$ are iteratively detected by means of stepwise regression.

6. A method for determining a temperature of a rechargeable battery of a vehicle, the method comprising:
 (a) applying, by a control system of the vehicle, an electric current to the rechargeable and detecting an impedance Z of the rechargeable battery at different frequencies f, so that a Nyquist plot is obtained;
 (b) determining at least one of the following T parameters:
  (i) a first T parameter ($p_{T1}$) in the form of the fourth SOC parameter ($p_{SOC4}$),
  (ii) a second T parameter ($p_{T2}$) in the form of the fifth SOC parameter ($p_{SOC5}$),
  (iii) a third T parameter ($p_{T3}$) in the form of the eighth SOH parameter ($p_{SOH8}$),
  (iv) a fourth T parameter ($p_{T4}$) in the form of the ninth SOH parameter ($p_{SOH9}$), and
  (v) a fifth T parameter ($p_{T5}$) in the form of an axial section frequency ($f_{AS}$), at which the imaginary part of the impedance Z is zero and which is greater than the semi-circular maximum frequency ($f_{HbM}$);
 (c) establishing a T row vector $\overrightarrow{P_T}$ from the T parameters and all mixed terms of the form $p_{T,m} \cdot p_{T,n}$, m=1, ..., 5, n=1, ..., m; and
 (d) multiplying the T row vector $\overrightarrow{P_T}$ by a saved calibration vector $\overrightarrow{A_T}$, thereby obtaining the temperature T,
 wherein a message is emitted or a power of the vehicle is reduced when the temperature drops below a predetermined maximum temperature.

7. The method according to claim 6, wherein all T parameters are determined.

8. The method according to claim 6, wherein the calculation of calibration vectors $\overrightarrow{A_{SOH}}$, $\overrightarrow{A_{SOC}}$ and/or $\overrightarrow{A_T}$ comprises the following steps:
 (α) providing a new rechargeable battery (12),
 (β) measuring a capacity $K_{SOH,ist}$ of the rechargeable battery (12) at room temperature,
 (χ) adjusting a state of charge SOC at room temperature, which is quantified by the state of charge parameter $K_{SOC,ist}$,
 (δ) adjusting a temperature of the rechargeable battery (12), which is quantified by the temperature $K_T$,
 (ε) determining the SOH parameter $p_{SOH,ist,i}$ (i=1, ..., 11), the SOC parameter $p_{SOC,ist,j}$, j=1, ..., 7 and the temperature parameter $p_{T,k}$ with k=1, ..., 5,
 (φ) repeating the steps (δ) and (ε) with Q temperatures with 4<Q<1000,
 (γ) repeating the steps (χ) to (Φ) with M states of charge,
 (η) ageing the rechargeable battery,
 (ι) repeating (N−1)-fold the steps (β) to (η) up to a specified capacity, so that N·M·Q measured values in the form of the ageing, state of charge and temperature dependent SOH parameters $p_{SOH,ist,i}$, SOC parameters $p_{SOC,ist,j}$ and T parameters $p_{T,k}$ are obtained, each with an associated ageing parameter $K_{SOH,ist}$, an associated state of charge parameter $K_{SOC,ist}$ and an associated temperature $K_{T,ist}$, and
 (φ) calculating the SOH calibration vector $\overrightarrow{A_{SOH}}$, the SOC calibration vector $\overrightarrow{A_{SOC}}$ and the T calibration vector $\overrightarrow{A_T}$ from the measured values.

9. The method according the claim 8, wherein the calculation of the SOH calibration vector $\overrightarrow{A_{SOH}}$ comprises the following steps:
 (α) establishing an SOH measured value vector $$\overrightarrow{M_{SOH,ist}} = \begin{pmatrix} K_{SOH,ist}(1) \\ K_{SOH,ist}(2) \\ \vdots \\ K_{SOH,ist}(N \cdot M \cdot Q - 1) \\ K_{SOH,ist}(N \cdot M \cdot Q) \end{pmatrix}$$

from the ageing-dependent ageing parameters $K_{SOH,ist}(r)$, r=1, ..., N·M·Q,
 (β) establishing an SOH parameter matrix $$P_{SOH,ist} = \begin{pmatrix} \overrightarrow{P}_{SOH,ist}(1) \\ \overrightarrow{P}_{SOH,ist}(2) \\ \vdots \\ \overrightarrow{P}_{SOH,ist}(N \cdot M \cdot Q) \end{pmatrix},$$

(χ) the rows of which contain the row vectors $\overrightarrow{P}_{SOH,ist}(r)$, r=1, ..., N·M·Q, wherein the row vector $\overrightarrow{P}_{SOH,ist}(r)$ is established from the SOH parameters and all mixed terms of the form $p_{SOH,ist,m} \cdot p_{SOH,ist,n}$, m=1, ..., 11, n=1, ..., m, and
 (δ) calculating the SOH calibration vector $\overrightarrow{A_{SOH}}$ that optimally approximates the system of equations $\overrightarrow{M_{SOH,ist}} = P_{SOH,ist} \cdot \overrightarrow{A_{SOH}}$ while only retaining the significant components of $\overrightarrow{A_{SOH}}$, wherein the non-significant components are set to zero and the significant components of $\overrightarrow{A_{SOH}}$ are iteratively detected by means of stepwise regression.

10. The method according to claim 7, wherein the calculation of the T calibration vector $\overrightarrow{A_T}$ comprises the following steps:
 (α) establishing a T vector $$\overrightarrow{M_{T,ist}} = \begin{pmatrix} K_{T,ist}(1) \\ K_{T,ist}(2) \\ \vdots \\ K_{T,ist}(N \cdot M \cdot Q - 1) \\ K_{T,ist}(N \cdot M \cdot Q) \end{pmatrix}$$

from the temperatures $K_{T,ist}(r)$, r=1, ..., N·M·Q,
 (β) establishing a T parameter matrix $$P_{T,ist} = \begin{pmatrix} \overrightarrow{P}_{T,ist}(1) \\ \overrightarrow{P}_{T,ist}(2) \\ \vdots \\ \overrightarrow{P}_{T,ist}(N \cdot M \cdot Q) \end{pmatrix}$$

the rows of which contain the row vectors $\vec{P}_{T,ist}(j)$, $j=1, \ldots, N \cdot M \cdot Q$, wherein the row vector $\vec{P}_{T,ist}$ is established from the T parameters and all mixed terms of the form $p_{T,ist,\,m} \cdot p_{T,ist,\,n}$, $m=1, \ldots, 5$, $n=1, \ldots, m$, ($\chi$) calculating the T calibration vector $\vec{A}_T$ that optimally approximates the system of equations $\vec{M}_T = P_{T,ist} \cdot \vec{A}_T$ while only retaining the significant components of $\vec{A}_T$, wherein the non-significant components are set to zero and wherein the significant components of $\vec{A}_T$ are iteratively detected by means of stepwise regression.

* * * * *